United States Patent
Mou et al.

(10) Patent No.: US 10,644,221 B2
(45) Date of Patent: May 5, 2020

(54) PIEZOELECTRIC ACTUATOR ELECTRODE ARRANGEMENT

(71) Applicant: Microjet Technology Co., Ltd., Hsinchu (TW)

(72) Inventors: Hao-Jan Mou, Hsinchu (TW); Ta-Wei Hsueh, Hsinchu (TW); Li-Pang Mo, Hsinchu (TW); Shih-Chang Chen, Hsinchu (TW); Ching-Sung Lin, Hsinchu (TW); Yung-Lung Han, Hsinchu (TW); Chi-Feng Huang, Hsinchu (TW); Chang-Yen Tsai, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 112 days.

(21) Appl. No.: 16/054,211

(22) Filed: Aug. 3, 2018

(65) Prior Publication Data
US 2019/0067550 A1    Feb. 28, 2019

(30) Foreign Application Priority Data
Aug. 22, 2017 (TW) .............................. 106128420 A

(51) Int. Cl.
*H01L 41/053* (2006.01)
*F04B 45/047* (2006.01)
(Continued)

(52) U.S. Cl.
CPC .......... *H01L 41/053* (2013.01); *F04B 17/003* (2013.01); *F04B 43/046* (2013.01);
(Continued)

(58) Field of Classification Search
CPC ............... H01L 41/053; H01L 41/0477; H01L 41/0973; F04B 39/123; F04B 19/006;
(Continued)

(56) References Cited

U.S. PATENT DOCUMENTS 9,112,002 B2 * 8/2015 Sullivan-Malervy ........................ H01L 21/7685
9,611,843 B2 * 4/2017 Hsueh .................... F04B 43/046
(Continued)

FOREIGN PATENT DOCUMENTS

| CN | 103885255 A | 6/2014 |
| CN | 104234986 A | 12/2014 |
| CN | 107023459 A | 8/2017 |

*Primary Examiner* — Nathan C Zollinger
(74) *Attorney, Agent, or Firm* — Birch, Stewart, Kolasch & Birch, LLP

(57) ABSTRACT

The actuator includes a suspension plate, an outer frame, at least one bracket and a piezoelectric plate. The suspension plate includes a first surface and a second surface and is capable of bending and vibrating. The outer frame surrounds a periphery of the suspension plate. The at least one bracket is connected between the suspension plate and the outer frame for supporting the suspension plate. The piezoelectric plate includes a first electrode and a second electrode made of silver palladium alloy doped with graphene. The first electrode is coated with a conducting layer made of graphene-doped paint, and the second electrode is coated with an adhesive layer made of graphene-doped epoxy glue. The adhesive layer is configured to attach and in adhesion with the first surface of the suspension plate. A voltage is applied to the first electrode and the second electrode to make the suspension plate bend and vibrate.

6 Claims, 6 Drawing Sheets

(51) Int. Cl.
| | |
|---|---|
| *F04B 43/04* | (2006.01) |
| *F04B 53/16* | (2006.01) |
| *F04B 17/00* | (2006.01) |
| *H01L 41/047* | (2006.01) |
| *H01L 41/09* | (2006.01) |
| *F04B 19/00* | (2006.01) |

(52) U.S. Cl.
CPC ............ *F04B 45/047* (2013.01); *F04B 53/16* (2013.01); *H01L 41/0477* (2013.01); *H01L 41/0973* (2013.01); *F04B 19/006* (2013.01)

(58) Field of Classification Search
CPC ...... F04B 43/046; F04B 39/121; F04B 53/16; F04B 53/004; F04B 45/047; A61M 15/0085; A61M 2205/42; H02P 25/032
See application file for complete search history.

(56) References Cited

U.S. PATENT DOCUMENTS

| | | | |
|---|---|---|---|
| 9,976,673 B2 * | 5/2018 | Chen | F16K 99/0048 |
| 9,989,047 B2 * | 6/2018 | Chen | F04B 45/047 |
| 10,056,542 B2 * | 8/2018 | Aliane | H04R 31/00 |
| 10,090,455 B2 * | 10/2018 | Aliane | H01L 41/047 |
| 10,269,564 B2 * | 4/2019 | Lin | H01L 21/0242 |
| 2012/0273255 A1 * | 11/2012 | Hemond | C09D 5/24 |
| | | | 174/126.2 |
| 2015/0071797 A1 | 3/2015 | Takeuchi | |
| 2015/0179922 A1 | 6/2015 | Kim et al. | |
| 2016/0076530 A1 * | 3/2016 | Chen | F04B 45/047 |
| | | | 417/413.2 |
| 2017/0223828 A1 * | 8/2017 | Tanielian | H05K 1/09 |

\* cited by examiner

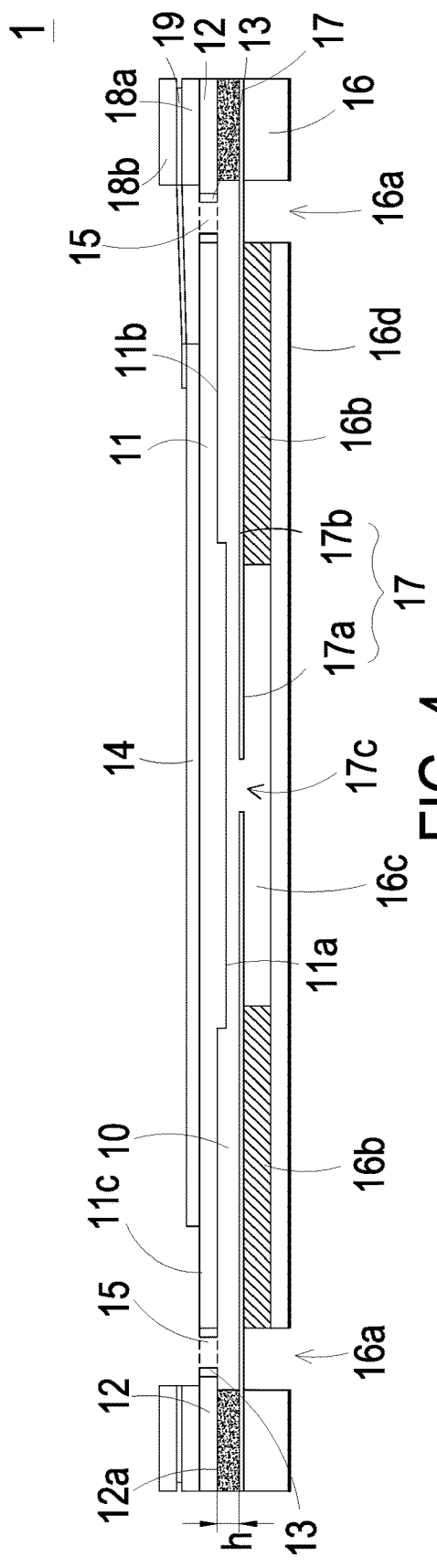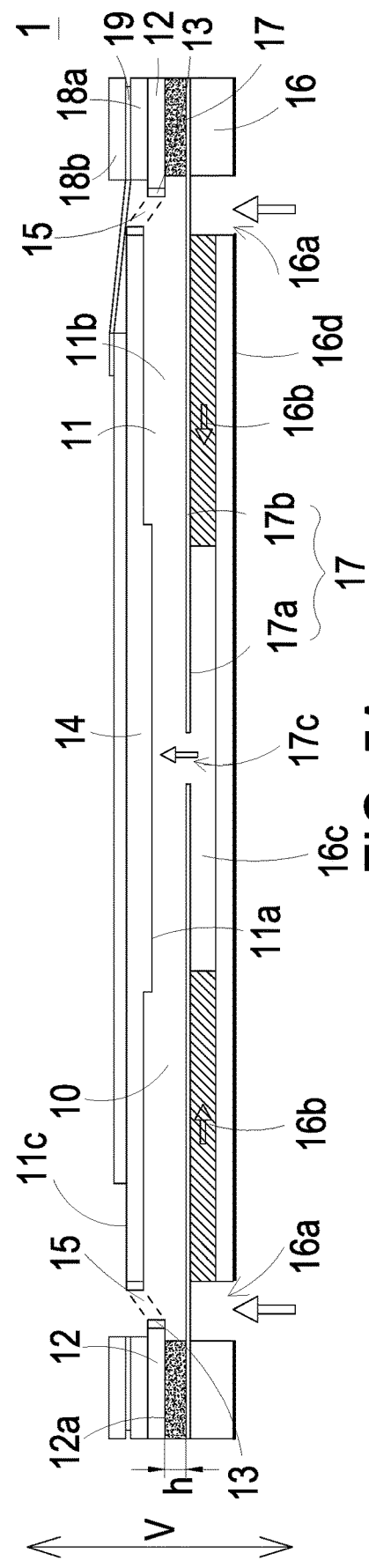

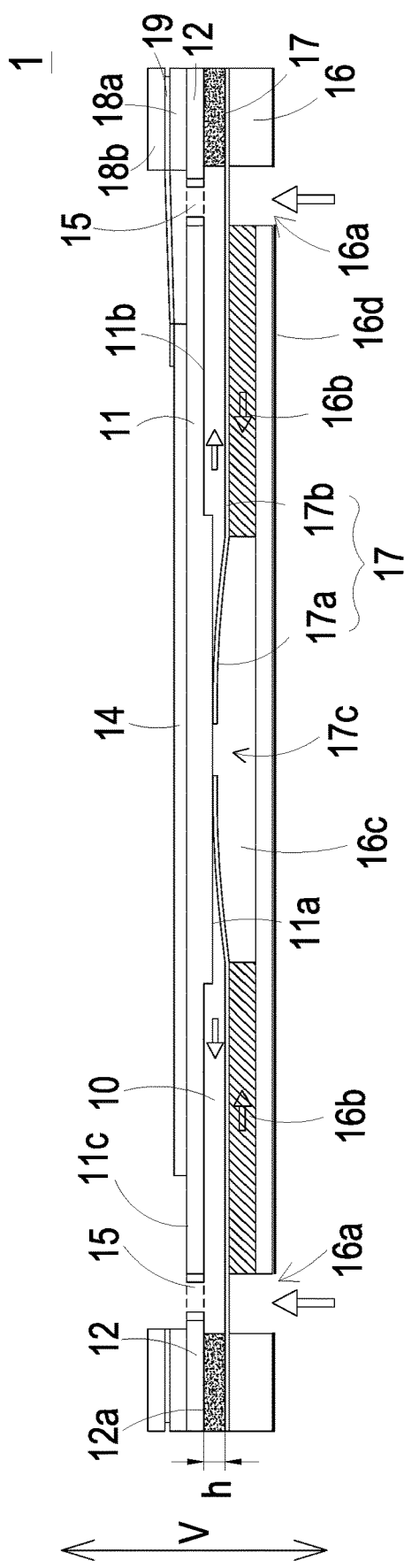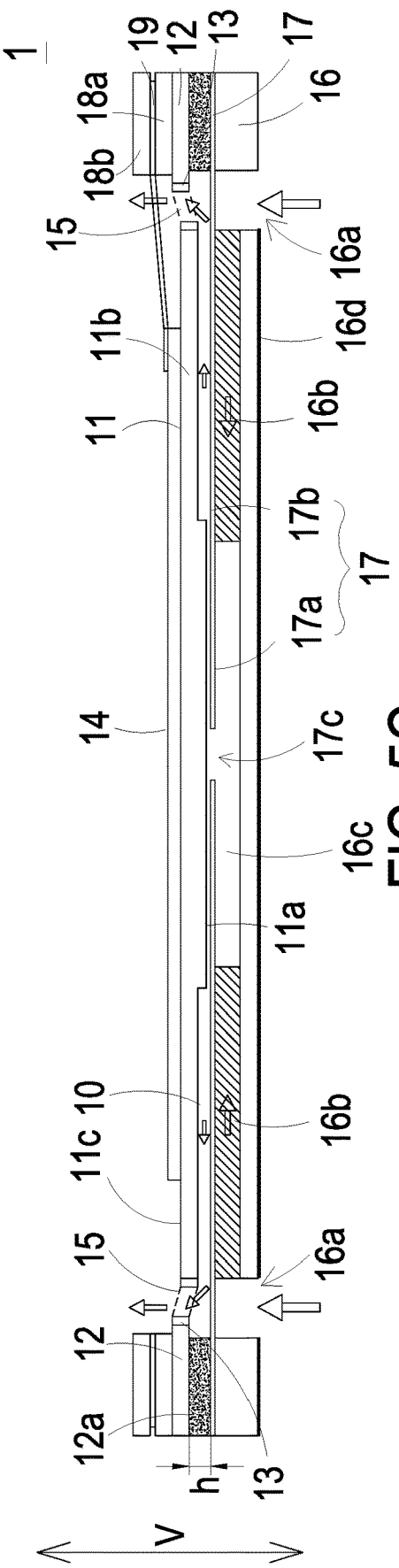

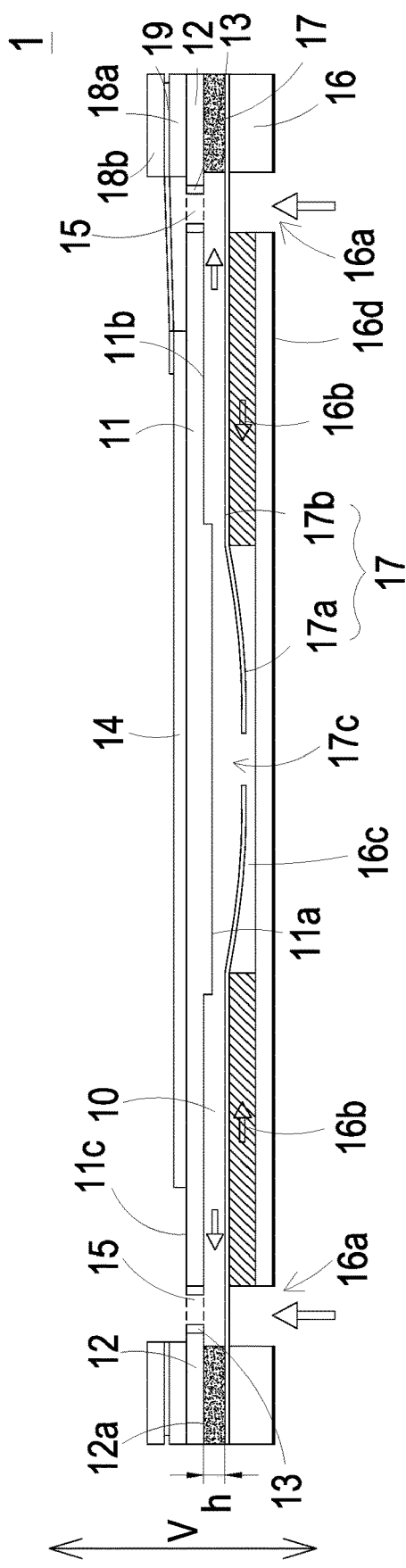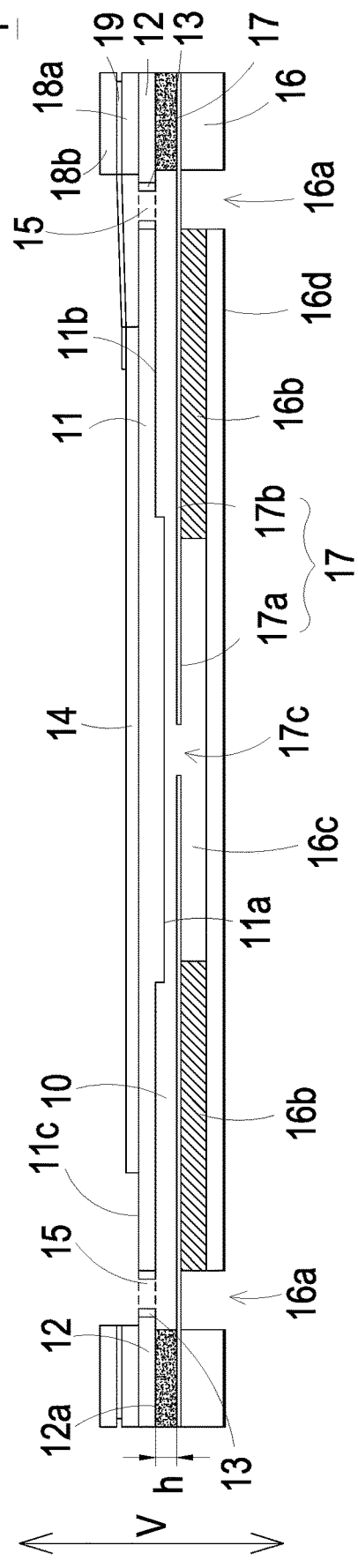

PIEZOELECTRIC ACTUATOR ELECTRODE ARRANGEMENT

FIELD OF THE INVENTION

The present disclosure relates to an actuator, and more particularly to a miniature, ultra-thin and silent actuator.

BACKGROUND OF THE INVENTION

In various fields such as medicine, computer technology, printing and energy industries, the products are developed toward elaboration and miniaturization, among which the actuators used in the products such as micropumps, atomizers, printheads and industrial printers are key techniques of the products. Therefore, it is important to provide an actuator with innovative structure to break through its technical bottleneck.

For example, in the medicine industry, there are many pneumatic devices or apparatuses, such as blood pressure monitors and portable or wearable devices or apparatuses, which use conventional motors or pressure valves to pump fluids. However, due to the volume limitations of the conventional motors and the pressure valves, the pneumatic devices or apparatuses are bulky in volume and hard to be downsized, and thus fail to meet the miniaturization requirement and are not portable. Moreover, the conventional motors and the pressure valves have problems of noise generation and poor heat-dissipation efficiency during operations, so they are neither friendly nor comfortable to the user.

Therefore, there is a need of providing an actuator for a pneumatic device or apparatus with small, miniature, silent, improved heat-dissipation, portable and comfortable benefits in order to eliminate the above drawbacks.

SUMMARY OF THE INVENTION

An object of the present disclosure is to provide an actuator including a piezoelectric plate combined with a suspension plate, so as to generate a pressure gradient in designed fluid channels to facilitate a fluid to flow at a high speed by fluid fluctuation resulted from high-frequency vibrations of the piezoelectric plate. Moreover, since there is an impedance difference between the inhaling direction and the discharging direction, the fluid can be transferred from the inhale end to the discharge end. Therefore, issues from the conventional pneumatic devices or apparatuses, which relate to the bulky size, the miniaturization requirement, being not portable and the noise generation, can be solved.

Another object of the present disclosure is to provide an actuator, wherein the piezoelectric plate thereof includes two electrodes made of silver palladium alloy doped with graphene, so as to decrease the impedance to increase the moving speed of the electron and increase the thermal conductivity to dissipate heat quickly. Moreover, the first electrode is coated with a conducting layer made of a graphene-doped paint, which also increases the thermal conductivity to dissipate heat quickly. The second electrode is coated with an adhesive layer made of a graphene-doped epoxy glue to attach and in adhesion with the first surface of the suspension plate, which also decreases the impedance to increase the moving speed of the electron and increases the thermal conductivity to dissipate heat quickly. Consequently, the actuator achieves excellent conductivity and driving capability and increases the thermal conductivity to dissipate heat quickly.

In accordance with an aspect of the present disclosure, an actuator is provided. The actuator includes a suspension plate, an outer frame, at least one bracket and a piezoelectric plate. The suspension plate includes a first surface and a second surface and is capable of bending and vibrating. The outer frame is arranged around a periphery of the suspension plate. The at least one bracket is connected between the suspension plate and the outer frame for elastically supporting the suspension plate. The piezoelectric plate includes a first electrode and a second electrode made of silver palladium alloy doped with graphene. The first electrode is coated with a conducting layer made of a graphene-doped paint, and the second electrode is coated with an adhesive layer made of a graphene-doped epoxy glue. The adhesive layer is configured to attach and in adhesion with the first surface of the suspension plate. A voltage is applied to the first electrode and the second electrode to make the suspension plate bend and vibrate.

The above contents of the present disclosure will become more readily apparent to those ordinarily skilled in the art after reviewing the following detailed description and accompanying drawings, in which:

BRIEF DESCRIPTION OF THE DRAWINGS

FIG. 4 is a schematic cross-sectional view illustrating the actuator with the gas inlet plate, the resonance plate, the first insulation plate, the conducting plate and the second insulation plate of the present disclosure; and FIGS. 5A to 5E schematically illustrate the actions of the actuator shown in FIG. 4.

DETAILED DESCRIPTION OF THE PREFERRED EMBODIMENT

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
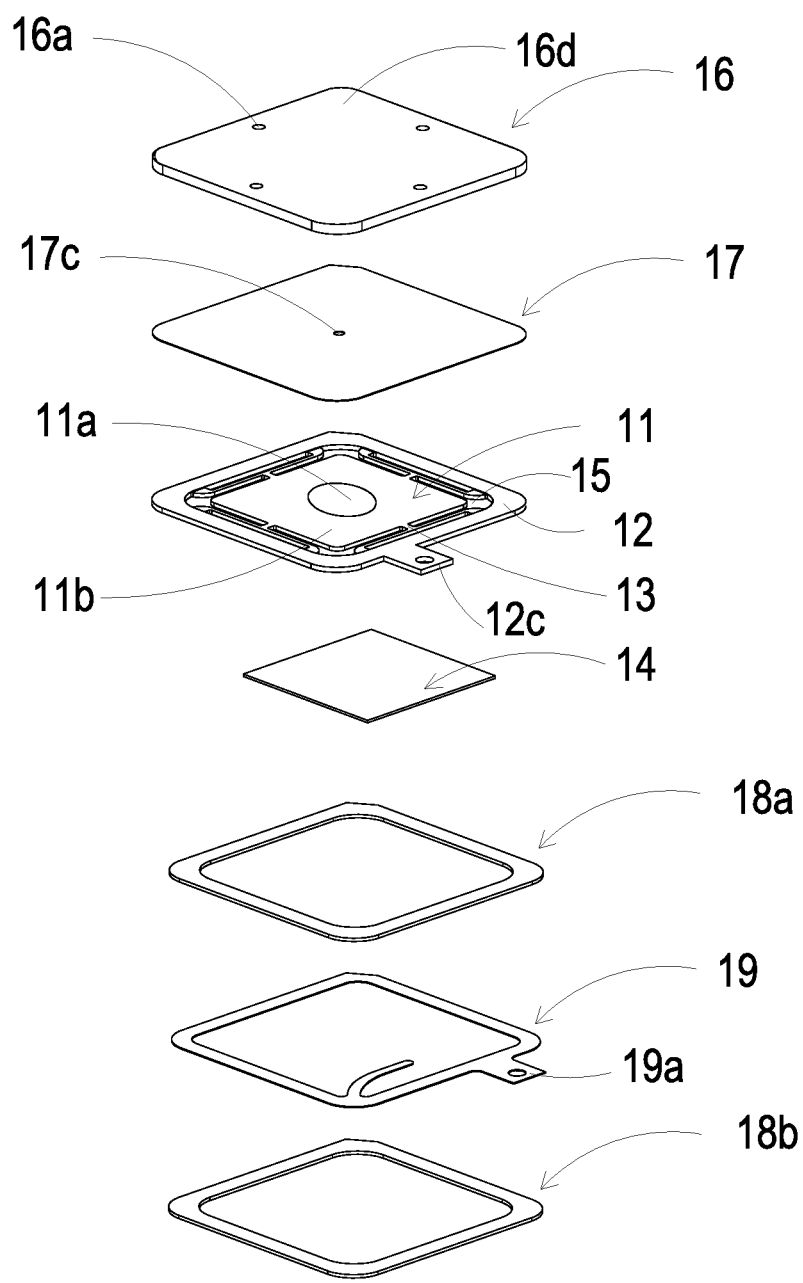
FIG. 1 is a schematic exploded view illustrating the actuator with the gas inlet plate, the resonance plate, the first insulation plate, the conducting plate and the second insulation plate of the present disclosure and taken along a front viewpoint.
Figure 2:
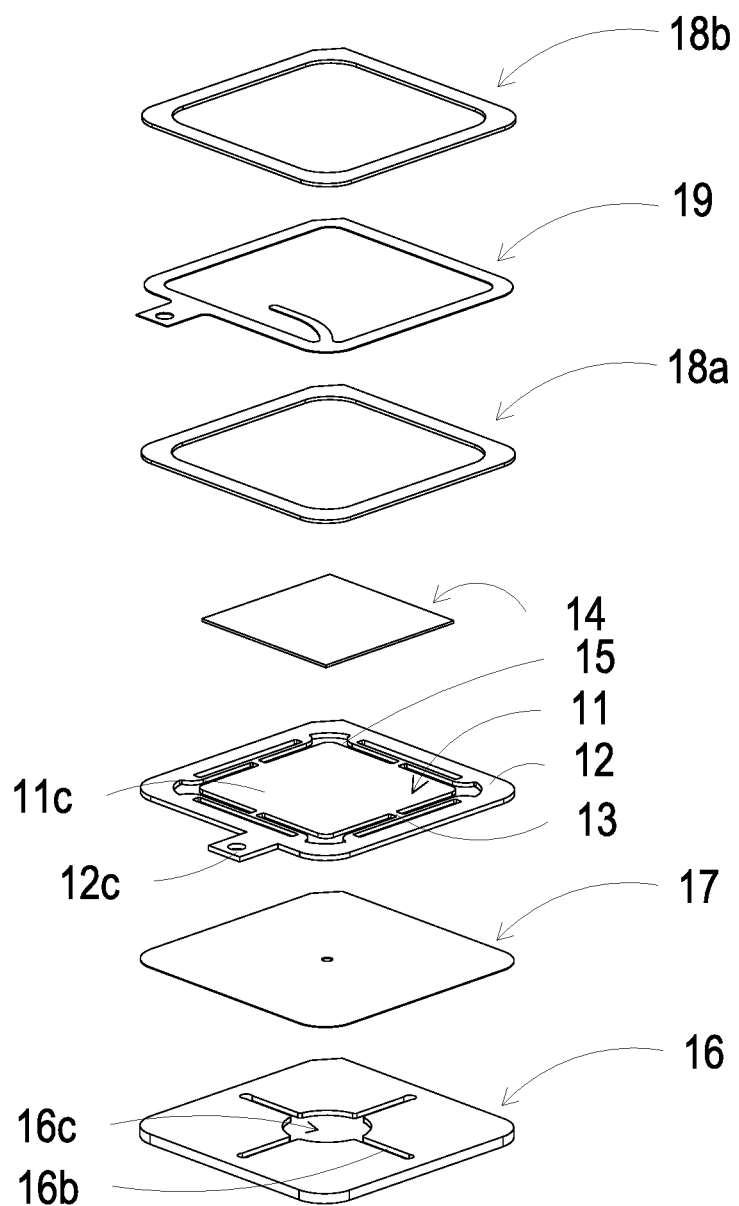
FIG. 2 is a schematic exploded view illustrating the actuator with the gas inlet plate, the resonance plate, the first insulation plate, the conducting plate and the second insulation plate of the present disclosure and taken along a rear viewpoint.
Figure 3:
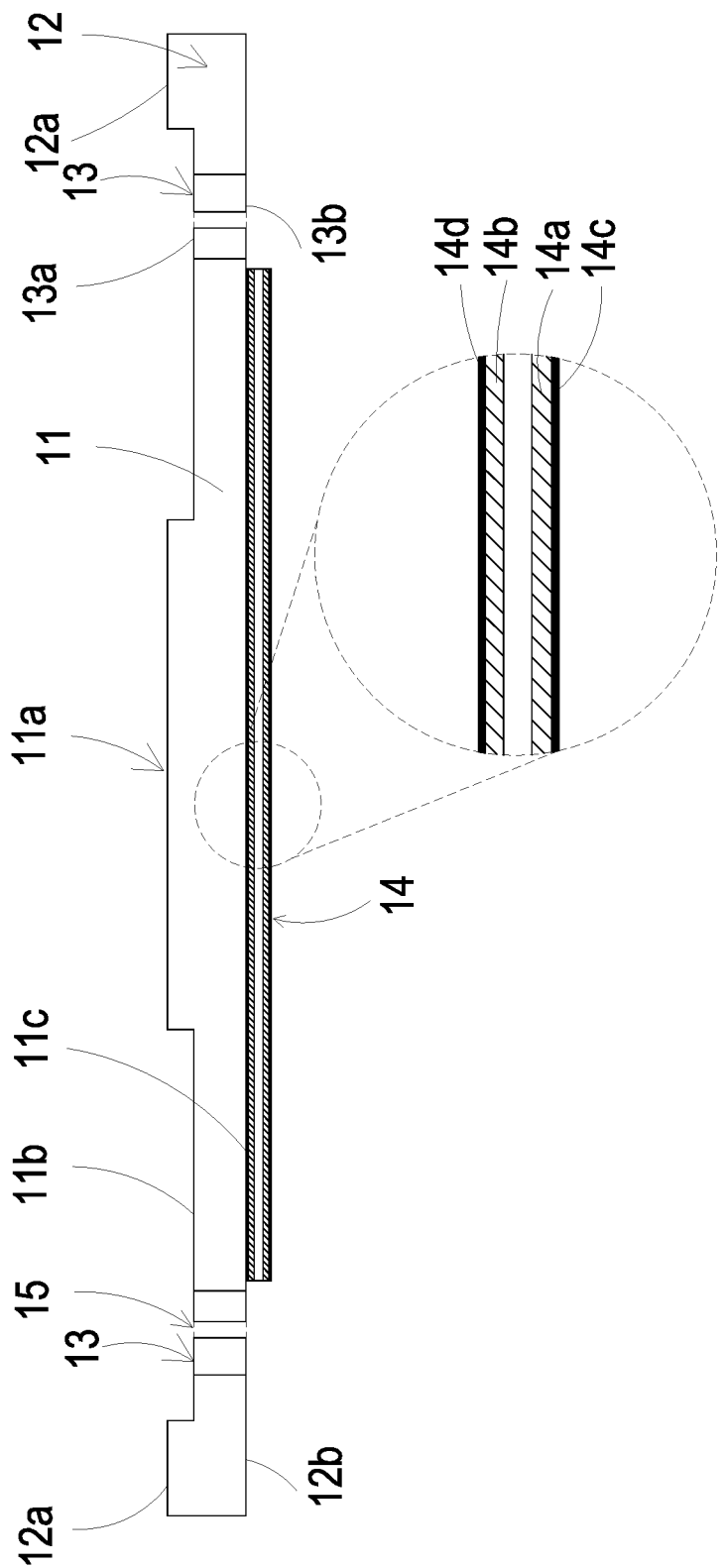
FIG. 3 shows a schematic cross-sectional view and a partial enlarged view illustrating of the relationship between the piezoelectric plate and the suspension plate, the bracket and the outer frame of the actuator of the present disclosure.

Please refer to FIGS. 1 to 3. The present disclosure provides an actuator 1 including at least one suspension plate 11, at least one outer frame 12, at least one bracket 13 and at least one piezoelectric plate 14. The number of the suspension plate 11, the outer frame 12, the bracket 13 and the piezoelectric plate 14 is exemplified by one for each in the following embodiments but not limited thereto. It is noted that each of the suspension plate 11, the outer frame 12, the bracket 13 and the piezoelectric plate 14 can also be provided in plural numbers.

Please refer to FIGS. 1, 2 and 4. The actuator 1 includes a suspension plate 11, an outer frame 12, at least one bracket 13 and a piezoelectric plate 14. The suspension plate 11 includes a first surface 11c and a second surface 11b and is capable of bending and vibrating along a vertical direction V (shown in FIGS. 5A to 5E). The outer frame 12 is arranged around a periphery of the suspension plate 11. The bracket 13 is connected between the suspension plate 11 and the outer frame 12. In this embodiment, the two ends of the bracket 13 are connected to the outer frame 12 and the suspension plate 11 respectively so that the bracket 13 can elastically support the suspension plate 11. At least one vacant space 15 is formed between the bracket 13, the suspension plate 11 and the outer frame 12 for allowing a gas to flow through. The type and the number of each of the suspension plate 11, the outer frame 12 and the bracket 13 may be varied according to the practical requirements. The outer frame 12 is arranged around the periphery of the suspension plate 11 and has a conducting pin 12c protruded outwardly so as to be electrically connected to an external circuit (not shown) but not limited thereto.

As shown in FIG. 3, the suspension plate 11 has a bulge 11a that makes the suspension plate 11 a stepped structure. The bulge 11a is formed on a second surface 11b of the suspension plate 11. The bulge 11a may be a circular convex structure. A top surface of the bulge 11a of the suspension plate 11 is coplanar with a second surface 12a of the outer frame 12, while the second surface 11b of the suspension plate 11 is coplanar with a second surface 13a of the bracket 13. Moreover, there is a specified depth from the bulge 11a of the suspension plate 11 (or the second surface 12a of the outer frame 12) to the second surface 11b of the suspension plate 11 (or the second surface 13a of the bracket 13). A first surface 11c of the suspension plate 11, a first surface 12b of the outer frame 12 and a first surface 13b of the bracket 13 are coplanar with each other, but not limited thereto.

The piezoelectric plate 14 is attached on the first surface 11c of the suspension plate 11. In some other embodiments, the suspension plate 11 may be a square plate structure with two flat surfaces, but the type of the suspension plate 11 may be varied according to the practical requirements. In this embodiment, the suspension plate 11, the bracket 13 and the outer frame 12 are integrally formed from a substrate, such as a metal plate (e.g., a stainless steel plate). In an embodiment, the length of a side of the piezoelectric plate 14 is smaller than the length of a side of the suspension plate 11. In another embodiment, the length of a side of the piezoelectric plate 14 is equal to the length of a side of the suspension plate 11. Similarly, the piezoelectric plate 14 is a square plate structure to have the same shape as the suspension plate 11, but not limited thereto. In this embodiment, the piezoelectric plate 14 includes a first electrode 14a and a second electrode 14b, which are made of silver palladium alloy doped with graphene. The first electrode 14a and the second electrode 14b are configured to decrease the impedance to increase the moving speed of the electron and increase the thermal conductivity to dissipate heat quickly. Moreover, the surface of the first electrode 14a is coated with a conducting layer 14c, which is made of a graphene-doped paint, to increase the thermal conductivity to dissipate heat quickly. The second electrode 14b is coated with an adhesive layer 14d, which is made of a graphene-doped epoxy glue, to attach and in adhesion with the first surface 11c of the suspension plate 11. The adhesive layer 14d can also decrease the impedance to increase the moving speed of the electron and increase the thermal conductivity to dissipate heat quickly. A voltage is applied to the first electrode 14a and the second electrode 14b to make the suspension plate 11 bend and vibrate along the vertical direction V.

Please refer to FIGS. 1 and 2. In this embodiment, the actuator 1 further includes a gas inlet plate 16, a resonance plate 17, a first insulation plate 18a, a second insulation plate 18b and a conducting plate 19. The suspension plate 11 is aligned with the resonance plate 17. The gas inlet plate 16, the resonance plate 17, the first insulation plate 18a, the conducting plate 19 and the second insulation plate 18b are stacked on each other sequentially. After the above components are combined together, the cross-sectional view of the resulting structure of the actuator 1 is shown in FIG. 4.

Please refer to FIGS. 1 and 2. In this embodiment, the gas inlet plate 16 includes at least one gas inlet 16a. Preferably but not exclusively, the gas inlet plate 16 includes four gas inlets 16a. The gas inlets 16a run through the gas inlet plate 16. In response to the action of the atmospheric pressure, the gas can be introduced into the actuator 1 through the at least one gas inlet 16a. The gas inlet plate 16 further includes at least one convergence channel 16b, and a central cavity 16c is located at the intersection of the convergence channels 16b. The central cavity 16c is in communication with the at least one convergence channel 16b. The gas inlet plate 16 further includes a first surface 16d coated with a graphene-doped paint, so that the thermal conductivity is increased to dissipate heat quickly. The at least one convergence channel 16b corresponds to the at least one gas inlet 16a on the first surface 16d of the gas inlet plate 16, such that the gas from the at least one gas inlet 16a would be guided to the central cavity 16c along the at least one convergence channel 16b. Consequently, the gas can be transferred by the actuator 1. In this embodiment, the at least one gas inlet 16a, the at least one convergence channel 16b and the central cavity 16c of the gas inlet plate 16 are integrally formed from a single substrate. The central cavity 16c defines a convergence chamber for temporarily storing the gas. In some embodiments, the gas inlet plate 16 may be, for example, made of stainless steel. Moreover, the depth of the convergence chamber defined by the central cavity 16c is equal to the depth of the at least one convergence channel 16b, but not limited thereto. The resonance plate 17 is made of a flexible material, but not limited thereto. The resonance plate 17 has a central aperture 17c corresponding to the central cavity 16c of the gas inlet plate 16, so as to allow the gas to flow therethrough. In other embodiments, the resonance plate 17 may be, for example, made of copper, but not limited thereto.

Please refer to FIGS. 1, 2 and 4. In this embodiment, the first insulation plate 18a, the conducting plate 19 and the second insulation plate 18b are stacked sequentially and located under the outer frame 12. The profiles of the first insulation plate 18a, the conducting plate 19 and the second insulation plate 18b substantially match the profile of the outer frame 12. In some embodiments, the first insulation plate 18a and the second insulation plate 18b are made of an insulating material (e.g., a plastic material) for providing insulating efficacy. In other embodiments, the conducting plate 19 is made of an electrically conductive material (e.g., a metallic material) for providing electrically conducting efficacy. Moreover, the conducting plate 19 has a conducting pin 19a so as to be electrically connected to an external circuit (not shown). The mentioned conducting pin 12c is electrically connected to the first electrode 14a of the piezoelectric plate 14, and the conducting pin 19a is electrically connected to the second electrode 14b of the piezoelectric plate 14.

Please refer to FIG. 4. In this embodiment, the gas inlet plate 16, the resonance plate 17, the outer frame 12, the insulation plate 18a, the conducting plate 19 and the second insulation plate 18b are stacked to form a device for transferring fluid (e.g., gas). Moreover, there is a gap h between the resonance plate 17 and the outer frame 12. In this embodiment, the gap h between the resonance plate 17 and the outer frame 12 may be filled with a filler (e.g., a conductive adhesive) so that a depth from the resonance plate 17 to the bulge 11a of the suspension plate 11 can be maintained. The gap h ensures the proper distance between the resonance plate 17 and the bulge 11a of the suspension plate 11, so that the fluid can be transferred quickly, the contact interference is reduced and the generated noise is largely reduced. In some embodiments, the height of the outer frame 12 is increased, so that a gap can still be formed between the outer frame 12 and the resonance plate 17, but not limited thereto.

Please refer to FIGS. 1, 2 and 4. In this embodiment, after the gas inlet plate 16, the resonance plate 17 and the outer frame 12 are combined together, a movable part 17a and a fixed part 17b of the resonance plate 17 are defined, wherein the movable part 17a surrounds the central aperture 17c. The convergence chamber for converging the gas is further defined by the movable part 17a of the resonance plate 17 and the gas inlet plate 16 collaboratively. Moreover, a first chamber 10 is formed between the resonance plate 17, the suspension plate 11, the bracket 13 and the outer frame 12 for temporarily storing the gas. Through the central aperture 17c of the resonance plate 17, the first chamber 10 is in communication with the convergence chamber formed within the central cavity 16c of the gas inlet plate 16. The peripheral regions of the first chamber 10 are in communication with the fluid channel through the vacant space 15 between the brackets 13.

Please refer to FIGS. 1, 2, 4 and 5A to 5E. When the piezoelectric plate 14 is enabled, the piezoelectric plate 14 vibrates along the vertical direction V in a reciprocating manner by using the bracket 13 as a fulcrum. As shown in FIG. 5A, the piezoelectric plate 14 vibrates in a first direction in response to the applied voltage. Since the resonance plate 17 is light and thin, the resonance plate 17 vibrates along the vertical direction V in resonance with the piezoelectric plate 14. More especially, a region of the resonance plate 17 spatially corresponding to the central cavity 16c of the gas inlet plate 16 is also subjected to a bending deformation. The region of the resonance plate 17 corresponding to the central cavity 16c of the gas inlet plate 16 is the movable part 17a of the resonance plate 17. When the piezoelectric plate 14 vibrates in the first direction, the movable part 17a of the resonance plate 17 is subjected to the bending deformation because the movable part 17a of the resonance plate 17 is pushed by the gas and vibrates in response to the piezoelectric plate 14. In response to the vibration of the piezoelectric plate 14 in the first direction, the gas is fed into the at least one gas inlet 16a of the gas inlet plate 16. Then, the gas is transferred to the central cavity 16c of the gas inlet plate 16 along the at least one convergence channel 16b. Then, the gas is transferred through the central aperture 17c of the resonance plate 17 spatially corresponding to the central cavity 16c, and introduced in the first direction into the first chamber 10. As the piezoelectric plate 14 is enabled, the resonance plate 17 is in resonance with the piezoelectric plate 14. Consequently, the resonance plate 17 vibrates along the vertical direction V in the reciprocating manner. As shown in FIG. 5B, during the vibration of the movable part 17a of the resonance plate 17 at this stage, the movable part 17a of the resonance plate 17 moves in the first direction to contact and attach on the bulge 11a of the suspension plate 11, and a distance from the fixed part 17b of the resonance plate 17 to a region of the suspension plate 11 except the bulge 11a remains the same. Owing to the deformation of the resonance plate 17 described above, a middle communication space of the first chamber 10 is sealed, and the volume of the first chamber 10 is compressed. Under this circumstance, the pressure gradient occurs to push the gas in the first chamber 10 moving toward peripheral regions of the first chamber 10 and flowing in the first direction through the vacant space 15 between the brackets 13 of the piezoelectric plate 14. Referring to FIG. 5C, the movable part 17a of the resonance plate 17 returns to its original position when the piezoelectric plate 14 vibrates in a second direction. Consequently, the volume of the first chamber 10 is continuously compressed to generate the pressure gradient which makes the gas in the first chamber 10 continuously pushed toward peripheral regions. Meanwhile, the gas is continuously fed into the at least one gas inlet 16a of the gas inlet plate 16, and transferred to the convergence chamber formed within the central cavity 16c along the convergence channel 16b. Then, as shown in FIG. 5D, the resonance plate 17 is in resonance with the vibration of the suspension plate 11 toward the second direction and thus moves in the second direction. That is, the movable part 17a of the resonance plate 17 also vibrates in the second direction. Consequently, it decreases the current of the gas from the at least one gas inlet 16a of the gas inlet plate 16 into the convergence chamber formed within the central cavity 16c. At last, as shown in FIG. 5E, the movable part 17a of the resonance plate 17 returns to its original position. As the embodiments described above, when the resonance plate 17 vibrates along the vertical direction V in the reciprocating manner, the gap h between the resonance plate 17 and the outer frame 12 is helpful to increase the maximum displacement along the vertical direction V during the vibration. In other words, the configuration of the gap h between the resonance plate 17 and the outer frame 12 can increase the amplitude of vibration of the resonance plate 17. Consequently, a pressure gradient is generated in the fluid channels of the actuator 1 to facilitate the gas to flow at a high speed. Moreover, since there is an impedance difference between the inhaling direction and the discharging direction, the gas can be transferred from the inhale end to the discharge end. Even if a gas pressure (which may impede the gas flow) exists at the outlet side, the actuator 1 still has the capability of pushing the gas into the fluid channel and then discharging the gas while achieving the silent efficacy. The steps of FIGS. 5A to 5E may be done repeatedly. Consequently, the gas is transferred by the actuator 1 from the outside to the inside.

From the above descriptions, the present disclosure provides an actuator, which generates the pressure gradient in the designed fluid channels to facilitate the fluid to flow at a high speed by the fluid fluctuation resulted from the high-frequency vibrations of the piezoelectric plate. Moreover, since there is an impedance difference between the inhaling direction and the discharging direction, the fluid can be transferred from the inhale end to the discharge end, which facilitates the fluid to flow at a high speed and flow continuously, so as to transfer the fluid quickly and also achieve the silent efficacy. Moreover, the actuator is miniaturized and thinned, so that the actuator has benefits of being portable and comfortable. Additionally, since the surface of the gas inlet plate and the electrodes of the piezoelectric plate are coated with graphene-doped compounds, the heat-dissipation efficiency is improved. Consequently, the actuator of the present disclosure is industrially valuable.

While the disclosure has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An actuator comprising:
   a suspension plate having a first surface and a second surface and being capable of bending and vibrating;
   an outer frame arranged around a periphery of the suspension plate;
   at least one bracket connected between the suspension plate and the outer frame for elastically supporting the suspension plate; and
   a piezoelectric plate having a first electrode and a second electrode made of silver palladium alloy doped with graphene, wherein the first electrode is coated with a conducting layer made of a graphene-doped paint, the second electrode is coated with an adhesive layer made of a graphene-doped epoxy glue, the adhesive layer is configured to attach and in adhesion with the first surface of the suspension plate, and a voltage is applied to the first electrode and the second electrode to make the suspension plate bend and vibrate.

2. The actuator according to claim 1, wherein the actuator further comprises:
   a gas inlet plate disposed on the side of the second surface of the suspension plate and having at least one gas inlet, at least one convergence channel and a central cavity defining a convergence chamber, wherein the at least one gas inlet allows the gas to flow in, and the convergence channel corresponds to the gas inlet and guides the gas from the gas inlet to the convergence chamber defined by the central cavity; and
   a resonance plate disposed between the gas inlet plate and the suspension plate and having a central aperture and a movable part, wherein the central aperture corresponds to the convergence chamber, and the movable part surrounds the central aperture,
   wherein there is a gap between the resonance plate and the suspension plate, the bracket and the outer frame to form a first chamber, so that when the piezoelectric plate is enabled and the suspension plate vibrates accordingly, the gas from the at least one gas inlet of the gas inlet plate is converged to the central cavity along the at least one convergence channel and flows into the first chamber through the central aperture of the resonance plate, whereby the gas is further transferred through a resonance effect between the suspension plate and the movable part of the resonance plate.

3. The actuator according to claim 2, wherein the gas inlet plate comprises a first surface, and the first surface is coated with a graphene-doped paint.

4. The actuator according to claim 2, wherein the suspension plate is a square plate structure and has a bulge.

5. The actuator according to claim 2, wherein the actuator further comprises a conducting plate, a first insulation plate and a second insulation plate, wherein the gas inlet plate, the resonance plate, the outer frame, the first insulation plate, the conducting plate and the second insulation plate are stacked on each other sequentially.

6. An actuator comprising:
   at least one suspension plate having a first surface and a second surface and being capable of bending and vibrating;
   at least one outer frame arranged around a periphery of the suspension plate;
   at least one bracket connected between the suspension plate and the outer frame for elastically supporting the suspension plate; and
   at least one piezoelectric plate having a first electrode and a second electrode made of silver palladium alloy doped with graphene, wherein the first electrode is coated with a conducting layer made of a graphene-doped paint, the second electrode is coated with an adhesive layer made of a graphene-doped epoxy glue, the adhesive layer is configured to attach and in adhesion with the first surface of the suspension plate, and a voltage is applied to the first electrode and the second electrode to make the suspension plate bend and vibrate.

* * * * *